(12) United States Patent
Peng et al.

(10) Patent No.: US 10,290,739 B2
(45) Date of Patent: May 14, 2019

(54) DEVICE AND METHOD OF DIELECTRIC LAYER

(71) Applicant: TAIWAN SEMICONDUCTOR MANUFACTURING CO., LTD., Hsinchu (TW)

(72) Inventors: Yu-Yun Peng, Hsinchu (TW); Keng-Chu Lin, Pingtung County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/053,656

(22) Filed: Aug. 2, 2018

(65) Prior Publication Data

US 2019/0103485 A1 Apr. 4, 2019

Related U.S. Application Data

(60) Provisional application No. 62/565,629, filed on Sep. 29, 2017.

(51) Int. Cl.
| | |
|---|---|
| *H01L 21/762* | (2006.01) |
| *H01L 29/78* | (2006.01) |
| *H01L 29/66* | (2006.01) |
| *H01L 29/06* | (2006.01) |
| *H01L 21/308* | (2006.01) |
| *H01L 21/768* | (2006.01) |
| *H01L 21/8234* | (2006.01) |
| *H01L 21/02* | (2006.01) |

(52) U.S. Cl.
CPC ........ *H01L 29/785* (2013.01); *H01L 21/0228* (2013.01); *H01L 21/308* (2013.01); *H01L 21/76283* (2013.01); *H01L 21/76831* (2013.01); *H01L 21/76832* (2013.01); *H01L 21/823431* (2013.01); *H01L 29/0649* (2013.01); *H01L 29/66545* (2013.01); *H01L 29/66795* (2013.01); *H01L 21/02142* (2013.01); *H01L 21/02145* (2013.01); *H01L 21/76224* (2013.01); *H01L 21/76837* (2013.01)

(58) Field of Classification Search
CPC ......... H01L 21/02142; H01L 21/02145; H01L 21/0228; H01L 21/76224; H01L 21/76831; H01L 21/76837
See application file for complete search history.

(56) References Cited

U.S. PATENT DOCUMENTS

| | | | |
|---|---|---|---|
| 6,657,276 B1 * | 12/2003 | Karlsson | H01L 21/76264 257/506 |
| 6,869,641 B2 | 3/2005 | Schmitt | |
| 8,643,101 B2 | 2/2014 | Kao et al. | |
| 9,330,963 B2 * | 5/2016 | King | H01L 21/02178 |

(Continued)

*Primary Examiner* — George R Fourson, III
(74) *Attorney, Agent, or Firm* — Maschoff Brennan

(57) ABSTRACT

A method includes etching a semiconductor substrate to form a trench extending from a top surface of the semiconductor substrate into the semiconductor substrate. A first liner layer is formed on sidewalls and a bottom of the trench. The trench is filled with a dielectric material after depositing the first liner layer. The dielectric material and the first liner layer include substantially the same metal-contained ternary dielectric material. Excess portions of the dielectric material and the first liner layer over the top surface of the semiconductor substrate are removed.

20 Claims, 13 Drawing Sheets

(56) References Cited

U.S. PATENT DOCUMENTS

| | | | |
|---|---|---|---|
| 2007/0096319 A1* | 5/2007 | Hsu | H01L 21/7682 257/750 |
| 2009/0200633 A1* | 8/2009 | Chapman | H01L 27/1463 257/466 |
| 2011/0108517 A1* | 5/2011 | Luong | H01J 37/32091 216/6 |
| 2011/0115005 A1* | 5/2011 | Coolbaugh | H01L 27/0629 257/296 |
| 2012/0187523 A1* | 7/2012 | Cummings | H01L 21/76224 257/506 |
| 2012/0292735 A1* | 11/2012 | Tan | H01L 21/76232 257/506 |
| 2013/0334651 A1* | 12/2013 | Doris | H01L 21/76897 257/506 |
| 2015/0232378 A1 | 8/2015 | Hassan et al. | |
| 2015/0255267 A1* | 9/2015 | Tapily | H01L 21/0228 438/763 |
| 2015/0340503 A1* | 11/2015 | Minari | H01L 29/66795 257/401 |
| 2017/0140998 A1* | 5/2017 | Xu | H01L 21/823807 |

* cited by examiner

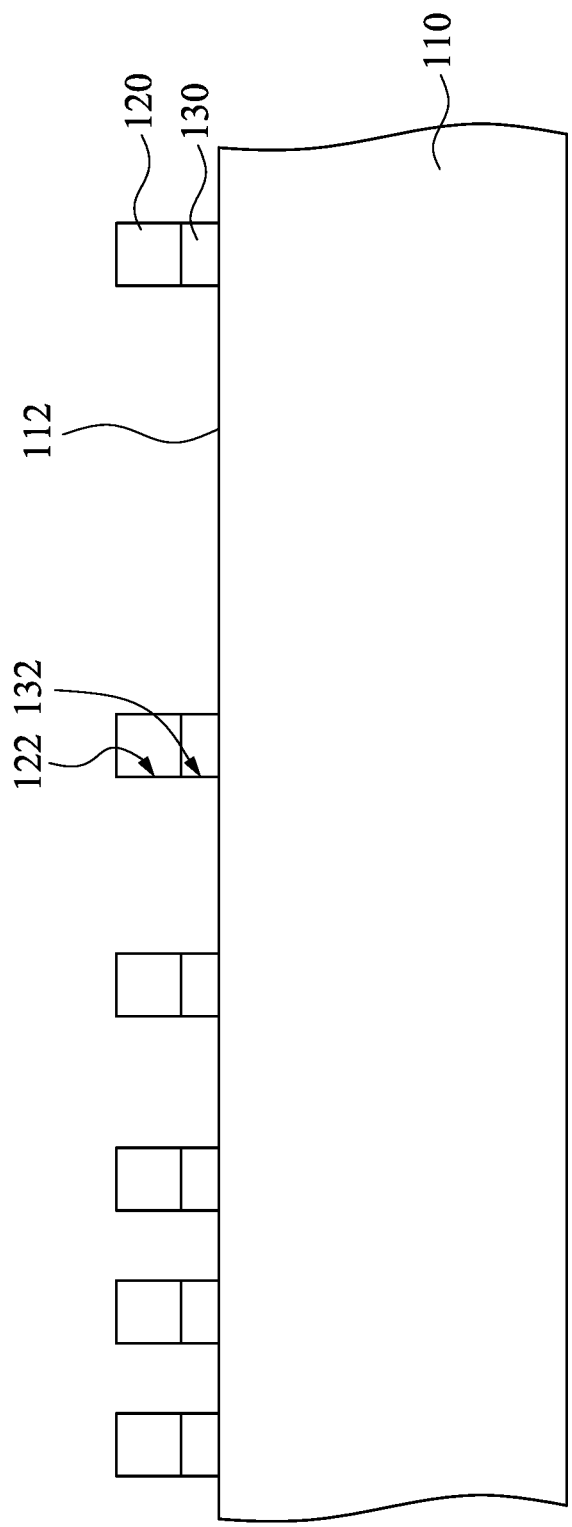

US 10,290,739 B2

DEVICE AND METHOD OF DIELECTRIC LAYER

PRIORITY CLAIM AND CROSS-REFERENCE

This application claims priority to U.S. Provisional Application Ser. No. 62/565,629, filed Sep. 29, 2017, which is herein incorporated by reference.

BACKGROUND

With advances in semiconductor technology, there has been increasing demand for high storage capacity, fast processing systems, high performance, and low costs. To meet these demands, the semiconductor industry continues to scale down dimension of semiconductor devices, such as metal oxide semiconductor field effect transistors (MOSFETs), and finFETs, and also increase packing density of these semiconductor devices on an integrated circuit (IC) to accommodate a larger number of the semiconductor devices on an IC. Such scaling down has increased the complexity of processing and manufacturing of the semiconductor devices in ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1F are cross-sectional views of a method for manufacturing a semiconductor structure at various stages in accordance with some embodiments of the present disclosure.

DETAILED DESCRIPTION

Figure 1B:
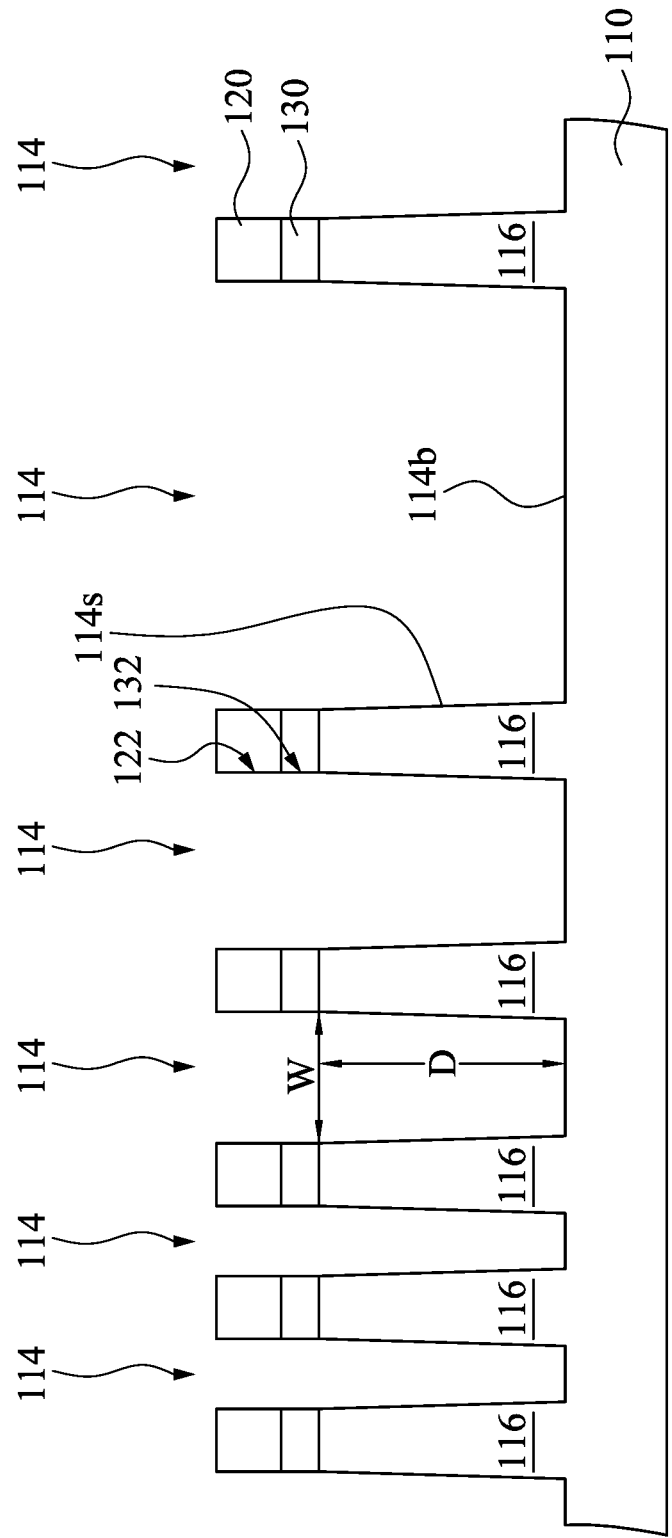

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-1F are cross-sectional views of a method for manufacturing a semiconductor structure at various stages in accordance with some embodiments of the present disclosure. In some embodiments, the semiconductor structure shown in FIGS. 1A-1F may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Reference is made to FIG. 1A. A substrate 110 is provided. In some embodiments, the substrate 110 is a semiconductor substrate. The substrate 110 may include silicon (Si). Alternatively, the substrate 110 may include germanium (Ge), silicon germanium (GaAs), gallium arsenide (GaAs), or other appropriate semiconductor materials. In some alternative embodiments, the substrate 110 may include an epitaxial layer. Furthermore, the substrate 110 may include a semiconductor-on-insulator (SOI) structure having a buried dielectric layer therein. The buried dielectric layer may be, for example, a buried oxide (BOX) layer. The SOI structure may be formed by a method referred to as separation by implantation of oxygen (SIMOX) technology, wafer bonding, selective epitaxial growth (SEG), or other appropriate method.

A patterned mask layer 120 (may be a hard mask layer) is formed over the top surface 112 of the substrate 110. In some embodiments, the patterned mask layer 210 includes nitride. For example, the mask layer 120 is made of silicon nitride (SiN). However, other materials, such as SiON, silicon carbide, or combinations thereof, may also be used. The mask layer 120 may be formed by a process such as chemical vapor deposition (CVD), plasma enhanced chemical vapor deposition (PECVD), or low pressure chemical vapor deposition (LPCVD). Alternatively, the mask layer 120 may be made of a silicon oxide and then converted to SiN by nitridation.

In some embodiments, a protective layer 130 is formed over the top surface 112 of the substrate 110 and between the mask layer 120 and the substrate 110. The protective layer 130 protects the top surface 112 from direct contact with the mask layer 120. For example, the protective layer 130 can protect active regions formed in the substrate 110. The active regions are used for forming devices (such as transistors, resistors, etc.). Depending upon the devices to be formed, the active regions may include either an n-well or a p-well as determined by the design conditions. In some embodiments, the protective layer 130 is made of a thermal oxide. Once formed, the mask layer 120 and the protective layer 130 are patterned through suitable photolithographic and etching processes to form openings 122 and 132 over the top surface 112.

Reference is made to FIG. 1B. The exposed portions of the substrate 110 through the openings 122 and 132 of FIG. 1A are removed by an etching process, such as reactive ion etching (RIE), in order to form the trenches 114 in the substrate 110. Each of the trenches 114 has a bottom 114b and sidewalls 114s. In some embodiments, the trenches 114 have different widths. Each of the trenches 114 has a width W and a depth D. The width W is in a range from about 6 nm to about 50 nm, and the depth D is in a range from about 48 nm to about 150 nm. An aspect ratio, the depth D (sometimes referred to herein as trench height) divided by the width W, of the trench 114 can be in a range from about 1 to about 18. One skilled in the art will realize, however, that the dimensions and values recited throughout the descriptions are examples, and may be changed to suit different scales of semiconductor devices.

In some embodiments, the semiconductor device can be a fin field effect transistor (FinFET), and the trenches 114 are configured to separate adjacent two semiconductor fins 116 formed in the substrate 110. In other words, one of the semiconductor fins 116 is between adjacent two of the trenches 114. In FIG. 1B, the adjacent semiconductor fins 116 have different pitches.

Figure 1C:
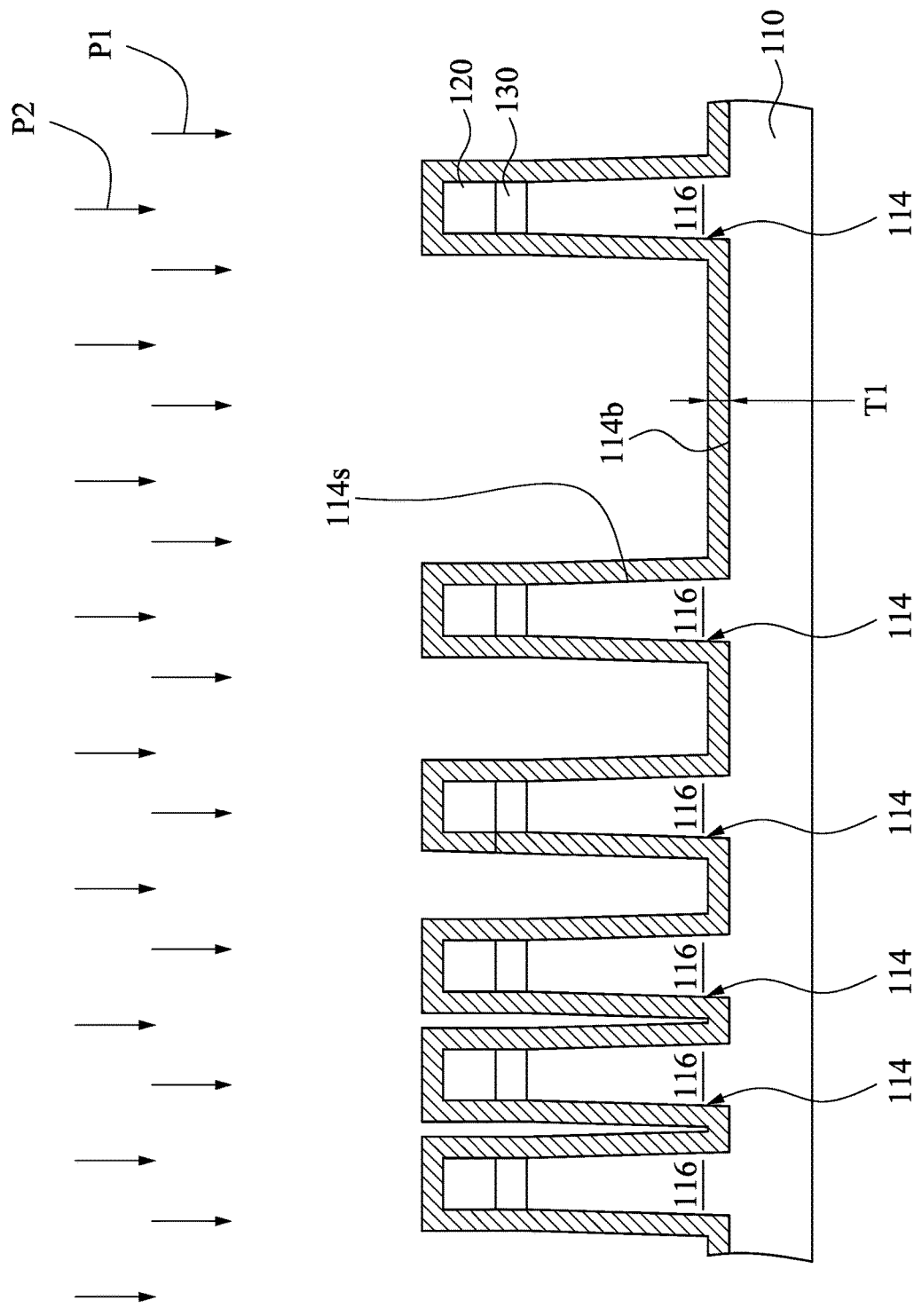

Reference is made to FIG. 1C. A first liner layer 140 is conformally formed over the structure of FIG. 1B, that is, on sidewalls 114s and the bottoms 114b of the trenches 114. The first liner layer 140 is formed using a deposition technique that can form conformal dielectric layers, such as thermal atomic layer deposition (ALD), plasma-enhanced (PE) ALD, pulsed PEALD, or atomic layer chemical vapor deposition (AL-CVD). ALD is an approach to filling dielectrics that involves depositing a monolayer of precursor over the substrate 110, purging the chamber, and introducing a reactant that reacts with the precursor to leave a monolayer of product. The cycle can be repeated many times to build a layer with a sufficient thickness to be functional. In FIG. 1C, the first liner layer 140 has a thickness T1, which is determined by the deposition cycles of first deposition processes. In some embodiments, the first liner layer 140 is formed by performing m cycles of the first deposition process to achieve the thickness T1, where m is equal to or greater than 1. In some embodiments, the thickness T1 is greater than half of the width W (see FIG. 1B) of the trench 114, and the present disclosure is not limited in this respect. Since the first liner layer 140 is formed by performing the ALD process, the first liner layer 140 has good conformality in the trenches 114 with different widths.

The first liner layer 140 includes elements A, B, and oxide, where A is metal, such as Al, Mg, Ti, Zn, Zr, Y, Ta, Hf, or other suitable metals, and B is Si or metal, such as Al, Mg, Ti, Zn, Zr, Y, Ta, Hf, or other suitable metals. The first liner layer 140 is a metal-contained ternary dielectric material ABO and is in a form of solid solution and/or metastable phase such as $Al_2TiO_5$, $MgAl_2O_4$, $Al_2SiO_5$, $ZnSiO_4$, or other materials. With these forms, the first liner layer 140 can be formed uniformly.

During the first deposition processes, the structure of FIG. 1B is positioned on a chuck in a deposition process chamber. A vacuum is then applied to the deposition process chamber to remove oxygen and moisture and the temperature is raised to an acceptable level that is suitable for the deposition. A first precursor P1 and a second precursor P2 are then sequentially fed into the deposition process chamber. The first precursor P1 provides the element A, the second precursor P2 provides the element B, and the first precursor P1, the second precursor P2, and oxygen form the first liner layer 140 over the structure of FIG. 1B, i.e., over the substrate 110 and the patterned mask layer 120 and in the trenches 114. The first precursor P1 and the second precursor P2 may be organic or halogen precursors, and the present disclosure is not limited in this respect.

The first precursor P1 is a metal-contained precursor and has a formula written as $AL_n$, L is [Cp]⁻, [Cp(Me)]⁻, [Cp(Et)]⁻, [N(Et)₂]⁻, [N(Me)₂]⁻, [Me]⁻, [Cl]⁻, or other suitable ligands, and n is integer. Cp is cyclepentadienyl, Me is metal, Et is ethyl, N is nitride, and Cl is chloride. The first precursor P1 can be $Al(CH_3)_3$ (TMA), $HfCl_4$, $Mg[Cp(Et)]_2$, or other suitable precursors.

In some embodiments, the second precursor P2 is a metal-contained precursor and has a formula written as $BL_n$, L is [Cp]⁻, [Cp(Me)]⁻, [Cp(Et)]⁻, [N(Et)₂]⁻, [N(Me)₂]⁻, [Me]⁻, [Cl]⁻, or other suitable ligands, and n is integer. The second precursor P2 can be $Zr[N(Et)_2]_4$ (TDEAZr) or other suitable precursors. In some other embodiments, the second precursor P2 is a silicon-contained precursor and has a formula written as $SiH_mL_n$, L is [NH₂]⁻, [N(Me)₂]⁻, [N(Et)₂]⁻, [O(Me)]⁻, [Me], [Cl]⁻, [Br]⁻, [I]⁻, or other suitable ligands, n≥2, and m+n=4. The second precursor P2 can be $SiCl_4$, $SiH_2[N(Et)_2]_2$, or other suitable precursors.

In some embodiments, process gases are fed into the deposition process chamber. The process gases are oxygen-contained gases, such as NO, $NO_2$, $O_2$, $O_3$, $H_2O$, and/or other suitable gases. In some embodiments, carrier gases are fed into the deposition process chamber. The carrier gases are He, Ar, $N_2$, and/or other suitable gases. In some embodiments, the first deposition processes can be plasma-enhanced deposition processes. That is, the first deposition processes include plasma treatments, for example at a frequency in a range from about 2M Hz to about 90M Hz.

In some embodiments, the first liner layer 140 is made of AlZrO in a form of solid solution and Al/Zr≤0.05. The first precursor P1 is $Al(CH_3)_3$ (TMA), the second precursor P2 is $Zr[N(Et)_2]_4$ (TDEAZr), and the first liner layer 140 is formed by performing PEALD processes. The carrier gases for forming the first liner layer 140 are Ar or other suitable gases. The process gases for forming the first liner layer 140 are $O_2$ or other suitable gases. The depositing temperature performed at a temperature in a range from about 100° C. to about 300° C. In some embodiments, the first liner layer 140 is formed by performing m cycles of the deposition processes, where m≥1. The first deposition processes include plasma treatments, for example at a power in a range from about 150 watts to about 800 watts.

In some other embodiments, the first liner layer 140 is made of HfSiO in a form of solid solution and Hf/Si is in a range from about 0.25 to about 1. The first precursor P1 is $HfCl_4$, the second precursor P2 is $SiCl_4$, and the first liner layer 140 is formed by performing thermal ALD processes. The carrier gases for forming the first liner layer 140 are $N_2$ or other suitable gases. In some embodiments, the process gases for forming the first liner layer 140 are $H_2O$ or other suitable gases, and the depositing temperature performed at a temperature in a range from about 150° C. to about 400° C. In some other embodiments, the process gases for forming the first liner layer 140 are $O_2$ or other suitable gases, and the depositing temperature performed at a temperature in a range from about 350° C. to about 650° C. In some embodiments, the first liner layer 140 is formed by performing m cycles of the deposition processes, where m≥1.

In still some other embodiments, the first liner layer 140 is made of MgSiO in a form of solid solution and Si/Mg≤0.02. Alternatively, the first liner layer 140 is made of MgSiO in a form of metastable phase such as $Mg_2SiO_4$ or $MgSiO_3$. The first precursor P1 is $Mg[Cp(Et)]_2$, the second precursor P2 is $SiH_2[N(Et)_2]_2$, and the first liner layer 140 is formed by performing thermal ALD processes. The carrier gases for forming the first liner layer 140 are $N_2$ and Ar, or other suitable gases. The process gases for forming the first liner layer 140 are $H_2O$ or other suitable gases, and the depositing temperature performed at a temperature in a range from about 150° C. to about 250° C. In some embodiments, the first liner layer 140 is formed by performing m cycles of the deposition processes, where m≥1. Alternatively, the first liner layer 140 is formed by performing PEALD processes. The carrier gases for forming the first liner layer 140 are $N_2$ and Ar, or other suitable gases. The process gases for forming the first liner layer 140 are $O_2$ or other suitable gases, and the depositing temperature performed at a temperature in a range from about 50° C. to about 250° C. In some embodiments, the first liner layer 140 is formed by performing m cycles of the deposition processes, where m≥1. The first deposition processes include plasma treatments, for example at a power in a range from about 20 watts to about 500 watts.

Figure 1D:
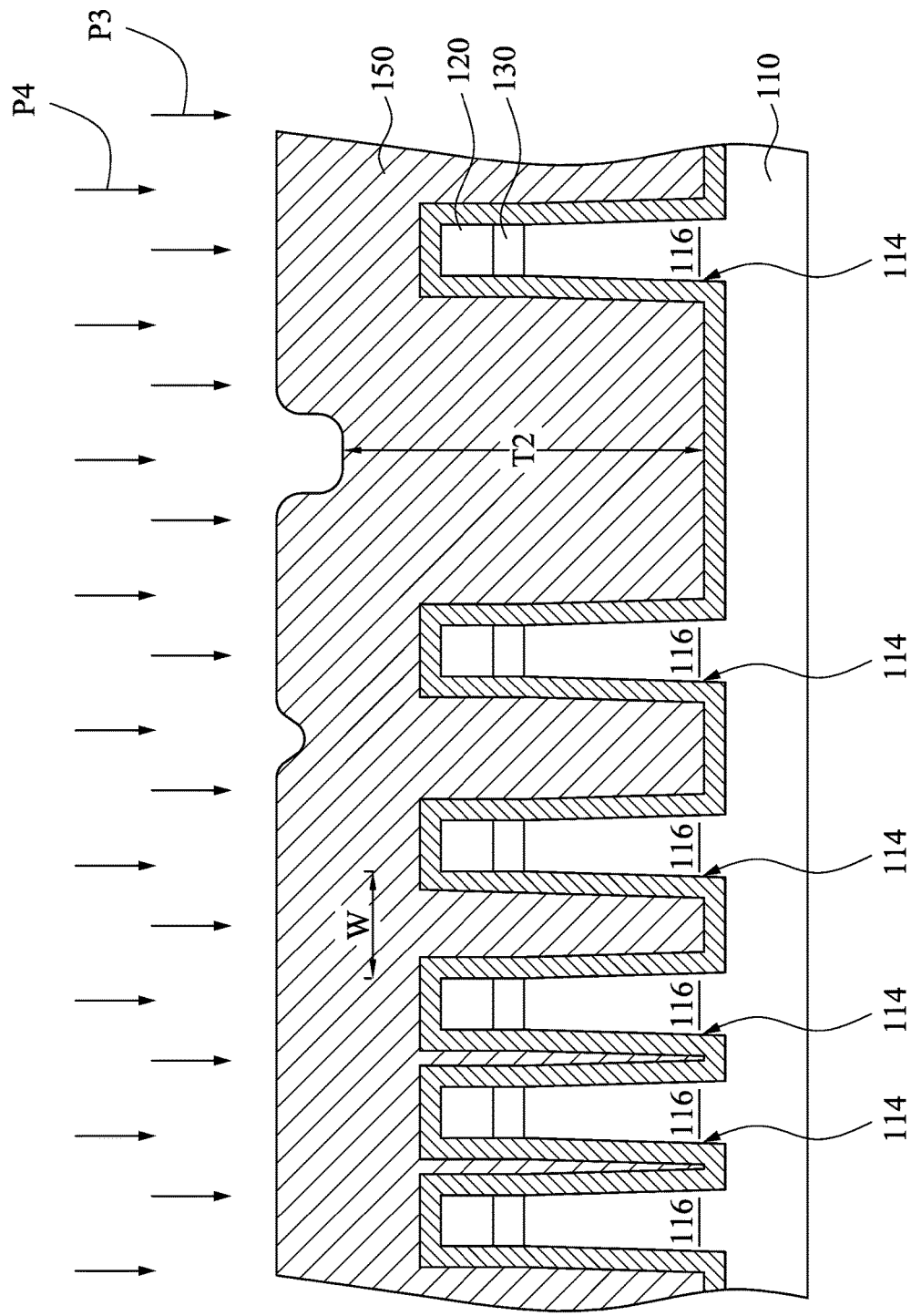

Reference is made to FIG. 1D. A dielectric material 150 is formed over the structure of FIG. 1C (i.e., over the first liner layer 140) and filling the trenches 114 by performing a second deposition process. The dielectric material 150 is formed using a deposition technique that can form a filling dielectric material, such as thermal chemical vapor deposition (CVD), PECVD, or remote-PEALD. In FIG. 1D, the dielectric material 150 has a minimum bottom-to-top thickness T2, which is greater than or equal to the width W of the trench 114, and the present disclosure is not limited in this respect. The minimum bottom-to-top thickness T2 may be the thickness of a portion of the dielectric material 150 in the widest trench 114.

The dielectric material 150 and the first liner layer 140 have substantially the same metal-contained ternary dielectric material. That is, the dielectric material 150 includes the elements A, B, and oxide. The dielectric material 150 is the ternary compound ABO and is in a form of solid solution and/or metastable phase such as $Al_2TiO_5$, $MgAl_2O_4$, $Al_2SiO_5$, $ZnSiO_4$, or other materials. With these forms, the dielectric material 150 can be formed uniformly.

During the second deposition process, the structure of FIG. 1C is positioned on a chuck in a deposition process chamber which may be the same as or different from the deposition process chamber of the first deposition processes. A third precursor P3 and a fourth precursor P4 are then sequentially fed into the deposition process chamber. The third precursor P3 provides the element A, the fourth precursor P4 provides the element B, and the third precursor P3, the fourth precursor P4, and oxygen form the dielectric material 150 over the structure of FIG. 1C, i.e., over the first liner layer 140. The third precursor P3 and the fourth precursor P4 may be organic or halogen precursors, and the present disclosure is not limited in this respect.

The third precursor P3 is a metal-contained precursor and has a formula written as $AL_n$, L is $[Cp]^-$, $[Cp(Me)]^-$, $[Cp(Et)]^-$, $[N(Et)_2]^-$, $[N(Me)_2]^-$, $[Me]^-$, $[Cl]^-$, or other suitable ligands, and n is integer. Cp is cyclopentadienyl, Me is metal, Et is ethyl, N is nitride, and Cl is chloride. The third precursor P3 can be $Al(CH_3)_3$ (TMA), $Hf[N(Et)_2]_4$, $Mg[Cp]_2$, or other suitable precursors.

In some embodiments, the fourth precursor P4 is a metal-contained precursor and has a formula written as $BL_n$, L is $[Cp]^-$, $[Cp(Me)]^-$, $[Cp(Et)]^-$, $[N(Et)_2]^-$, $[N(Me)_2]^-$, $[Me]^-$, $[Cl]^-$, or other suitable ligands, and n is integer. The fourth precursor P4 can be $Zr[N(Et)_2]_4$ (TDEAZr) or other suitable precursors. In some other embodiments, the fourth precursor P4 is a silicon-contained precursor and has a formula written as $SiH_mL_n$, L is $[NH_2]^-$, $[N(Me)_2]^-$, $[N(Et)_2]^-$, $[O(Me)]^-$, [Me], $[Cl]^-$, $[Br]^-$, $[I]^-$, or other suitable ligands, n≥2, and m+n=4. The fourth precursor P4 can be $SiH_4$, $SiH_2[O(Me)]_2$, or other suitable precursors.

In some embodiments, process gases are fed into the deposition process chamber. The process gases are oxygen-contained gases, such as NO, $NO_2$, $O_2$, $O_3$, $H_2O$, and/or other suitable gases. In some embodiments, carrier gases are fed into the deposition process chamber. The carrier gases are He, Ar, $N_2$, and/or other suitable gases. In some embodiments, the second deposition process can be a plasma-enhanced deposition process. That is, the first deposition processes include plasma treatments, for example at a frequency in a range from about 2M Hz to about 90M Hz.

In some embodiments, the first liner layer 140 and the dielectric material 150 are made of AlZrO in a form of solid solution and Al/Zr≤0.05. The third precursor P3 is $Al(CH_3)_3$ (TMA), the fourth precursor P4 is $Zr[N(Et)_2]_4$ (TDEAZr), and the dielectric material 150 is formed by performing a PECVD process. The carrier gases for forming the dielectric material 150 are $N_2$ or other suitable gases. The process gases for forming the dielectric material 150 are $O_2$ or other suitable gases. The depositing temperature performed at a temperature in a range from about 400° C. to about 600° C. The second deposition process includes a plasma treatment, for example at a power in a range from about 150 watts to about 800 watts.

In some other embodiments, the first liner layer 140 and the dielectric material 150 are made of HfSiO in a form of solid solution and Hf/Si is in a range from about 0.25 to about 1. The third precursor P3 is $Hf[N(Et)_2]_4$, the fourth precursor P4 is $SiH_4$, and the dielectric material 150 is formed by performing a PECVD processes. The carrier gases for forming the dielectric material 150 are $N_2$ or other suitable gases. In some embodiments, the process gases for forming the dielectric material 150 are $O_2$ or other suitable gases, and the depositing temperature performed at a temperature in a range from about 300° C. to about 450° C. The second deposition process includes a plasma treatment, for example at a power in a range from about 150 watts to about 800 watts.

In still some other embodiments, the first liner layer 140 and the dielectric material 150 are made of MgSiO in a form of solid solution and Si/Mg≤0.02. Alternatively, the dielectric material 150 is made of MgSiO in a form of metastable phase such as $Mg_2SiO_4$ or $MgSiO_3$. The third precursor P3 is $Mg[Cp]_2$, the fourth precursor P4 is $SiH_2[O(Me)]_2$, and the dielectric material 150 is formed by performing a PECVD process. The carrier gases for forming the dielectric material 150 are $N_2$ or other suitable gases. The process gases for forming the dielectric material 150 are $O_2$ or other suitable gases, and the depositing temperature performed at a temperature in a range from about 350° C. to about 550° C. The second deposition process includes a plasma treatment, for example at a power in a range from about 200 watts to about 750 watts.

Figure 1E:
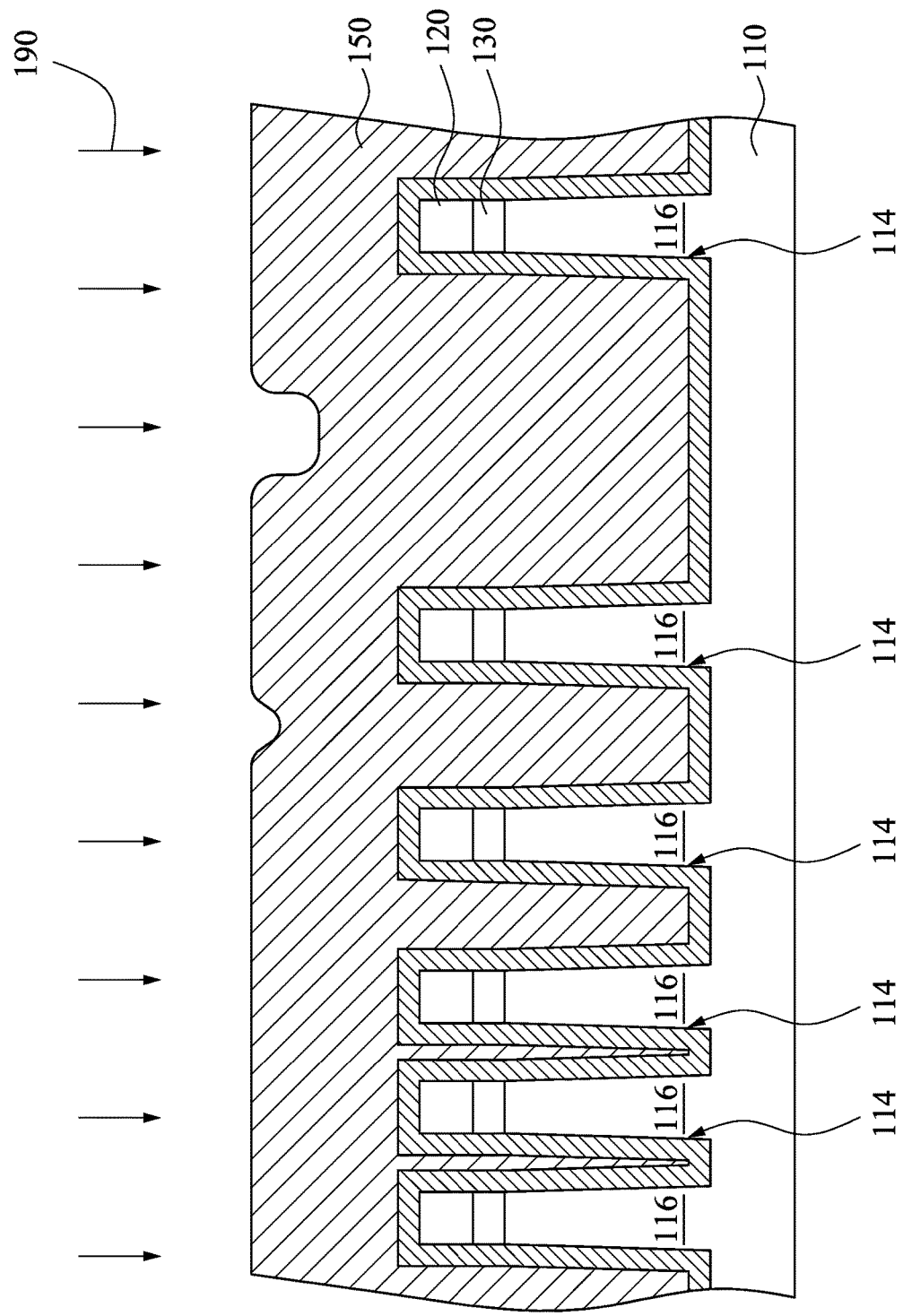

Reference is made to FIG. 1E. An anneal process 190 is performed on the first liner layer 140 and the dielectric material 150. The anneal process 190 is performed to remove the hydrogen in the first liner layer 140 and the dielectric material 150 to strengthen the mechanical strength thereof. In some embodiments, when the first liner layer 140 and the dielectric material 150 are made of AlZrO, the anneal process 190 can be performed at a temperature in a range from about 250° C. to about 600° C. In some other embodiments, when the first liner layer 140 and the dielectric material 150 are made of HfSiO, the anneal process 190 can be performed at a temperature in a range from about 350° C. to about 650° C. In still some other embodiments, when the first liner layer 140 and the dielectric material 150 are made of MgSiO, the anneal process 190 can be performed at a temperature in a range from about 350° C. to about 1100° C.

In some embodiments, when the first liner layer 140 and the dielectric material 150 are made of AlZrO, the resulting first liner layer 140 and dielectric material 150 have a Young's modulus in a range from about 200 GPa to about 350 GPa. The first liner layer 140 and the dielectric material 150 has a ($CH_xF_y$+02) plasma dry etching selectivity to oxide in a range of about 5 to about 8. In the present disclosure, the etching selectivity to oxide is defined by the rate of a chosen etchant (i.e., ($CH_xF_y$+02)) in this case) etching oxide dividing the rate of the chosen etchant etching the first liner layer 140 and the dielectric material 150. Moreover, the first liner layer 140 and the dielectric material 150 conduct a leakage current density of about $10^{-8}$ A/cm$^2$ to about $10^{-10}$ A/cm$^2$ and a breakdown field of about 7.5 MV/cm to about 13 MV/cm.

In some other embodiments, when the first liner layer 140 and the dielectric material 150 are made of HfSiO, the resulting first liner layer 140 and dielectric material 150 have a Young's modulus in a range from about 70 GPa to about 175 GPa. The first liner layer 140 and the dielectric material 150 has an ($NF_3$+$NH_3$) etching selectivity to oxide in a range of about 5 to about 8, a $Cl_2$-based etching selectivity to Si in a range of about 10 to about 14, and a dHF 1000:1 wet etching selectivity to nitride in a range of about 3.3 to about 5. Moreover, the first liner layer 140 and the dielectric material 150 conduct a leakage current density of about $10^{-7}$ A/cm$^2$ to about $10^{-10}$ A/cm$^2$ and a breakdown field of about 7.5 MV/cm to about 12 MV/cm.

In still some other embodiments, when the first liner layer 140 and the dielectric material 150 are made of MgSiO, the resulting first liner layer 140 and dielectric material 150 have a Young's modulus in a range from about 70 GPa to about 230 GPa. The first liner layer 140 and the dielectric material 150 have an ($NF_3$+$NH_3$) etching selectivity to oxide in a range of about 20 to about 26, a $Cl_2$-based etching selectivity to Si in a range of about 10 to about 15, and a 20% vol $H_2SO_4$ wet etching rate at about 70° C. in a range of about 0 to about 30 Angstrom/s. Moreover, the first liner layer 140 and the dielectric material 150 conduct a leakage current density of about $10^{-8}$ A/cm$^2$ to about $10^{-10}$ A/cm$^2$ and a breakdown field of about 10 MV/cm to about 13 MV/cm.

Figure 1F:
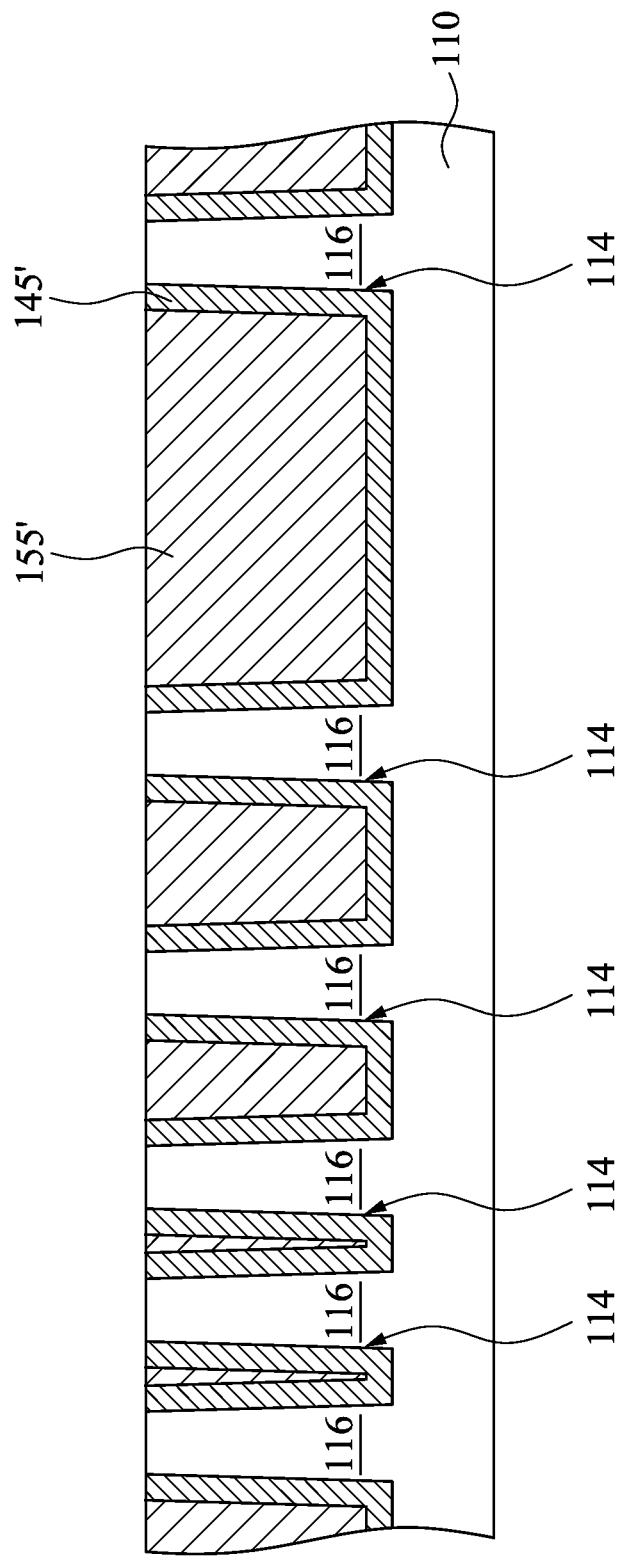

Reference is made to FIG. 1F. A planarization process is performed to remove the first liner layer 140 and the dielectric material 150 outside the trenches 114 to respectively form the first liner layer 140' and the isolation material 150', where the first liner layer 140' wraps around the isolation material 150'. The performance of the planarized structure can be improved since the first liner layer 140 and the dielectric material 150 have good mechanical strength and chemical selectivity. In detail, if the dielectric layer filled in the trenches 114 has weak mechanical strength (mismatched to that of the semiconductor fins 116), a portion of the dielectric layer in the widest trench 114 has lower mechanical strength and another portion of the dielectric layer in the narrowest trench 114 has higher mechanical strength. These two portions of dielectric layer may be easy to be removed and thus are planarized to different levels. That is, the portion of the planarized dielectric layer in the widest trench 114 has a level (top surface) lower than the portion of the planarized dielectric layer in the narrowest trench 114, such that the planarization process may not form a uniform top surface. In contrary, since the first liner layer 140 and the dielectric material 150 of FIG. 1F have good mechanical strength (matched to that of the semiconductor fins 116), these two layers are not easy to be removed compared to the weak-mechanical-strength material, such that the planarization process can form a more uniform top surface. In some embodiments, the planarization process is a chemical-mechanical polishing (CMP) process. In some embodiments, the planarization process also removes the mask layer 120 and the protective layer 130 (see FIG. 1E). The resulting first liner layer 140 and dielectric material 150 can be referred as to a shallow trench isolation (STI) structure to isolate the semiconductor fins 116. In some embodiments, a gate dielectric and a gate electrode (not shown) can be formed on or above the semiconductor fins 116 to form a FinFET.

Figure 2:
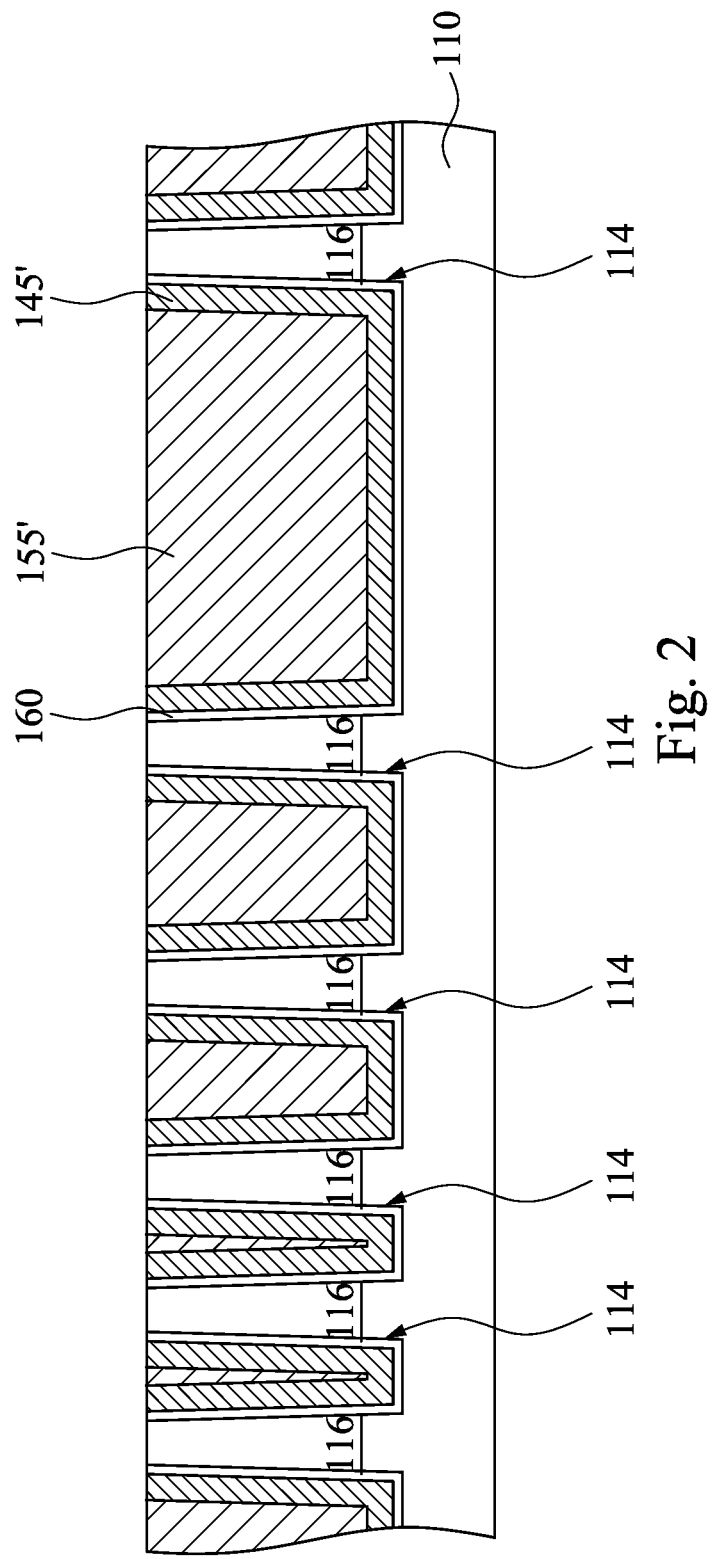
FIG. 2 is a cross-sectional view of a semiconductor structure in accordance with some embodiments of the present disclosure.

FIG. 2 is a cross-sectional view of a semiconductor structure in accordance with some embodiments of the present disclosure. The difference between the semiconductor structures of FIGS. 2 and 1F pertains to a second liner layer 160. In FIG. 2, the semiconductor structure further includes the second liner layer 160 between the substrate 110 and the first liner layer 140. The second liner layer 160 may be made of nitride to protect the materials under the second liner layer 160 (i.e. the substrate 110 in this case). For example, the second liner layer 160 can protect the materials under the second liner layer 160 from oxidation. Other relevant structural details of the semiconductor structure of FIG. 2 are similar to the semiconductor device of FIG. 1F, and, therefore, a description in this regard will not be repeated hereinafter.

FIGS. 3A-3D are cross-sectional views of a method for manufacturing a semiconductor structure at various stages in accordance with some embodiments of the present disclosure. In some embodiments, the semiconductor structure shown in FIGS. 3A-3D may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 3A:
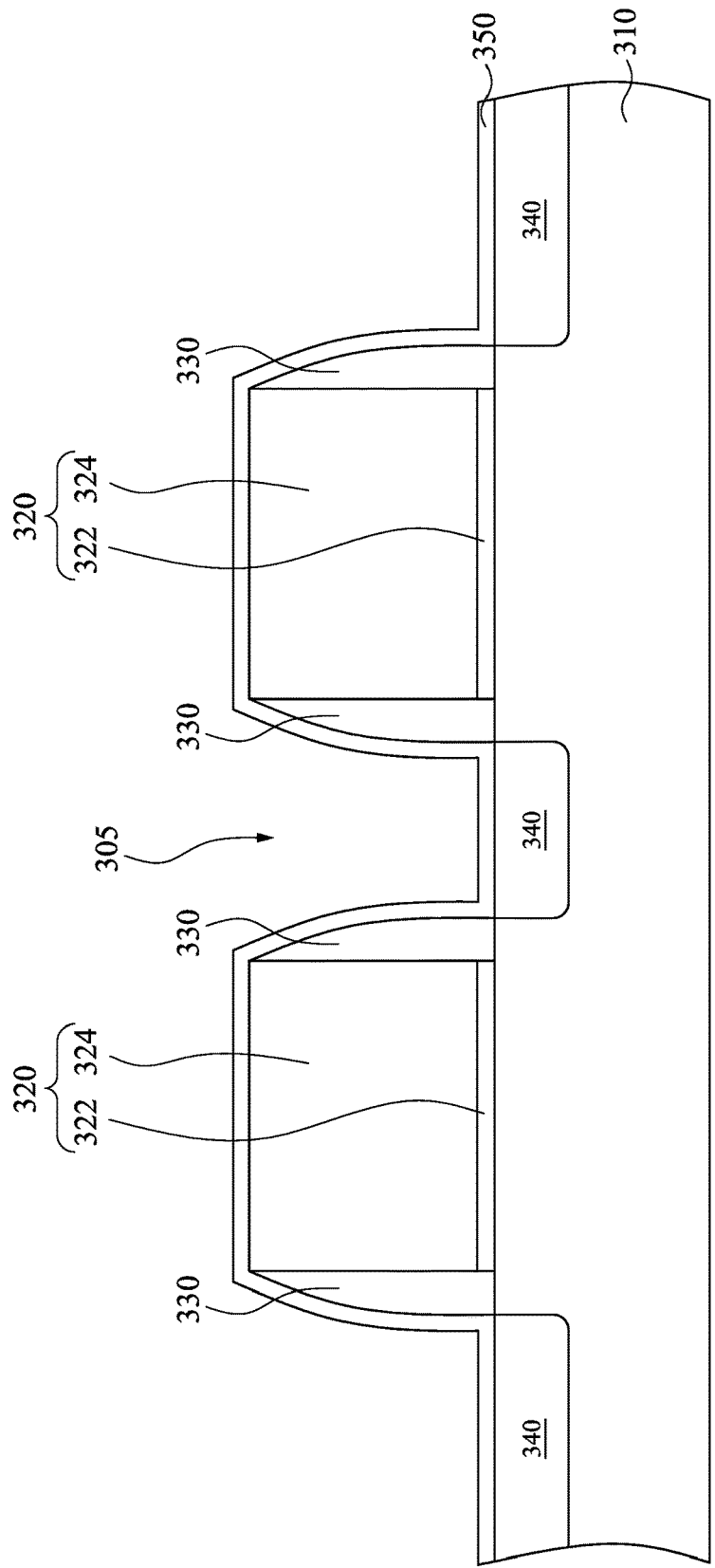
FIGS. 3A-3D are cross-sectional views of a method for manufacturing a semiconductor structure at various stages in accordance with some embodiments of the present disclosure.

Reference is made to FIG. 3A. A substrate 310 is provided. In some embodiments, the substrate 310 is a semiconductor substrate. The substrate 310 may include silicon (Si). Alternatively, the substrate 310 may include germanium (Ge), silicon germanium, gallium arsenide (GaAs), or other appropriate semiconductor materials. In some alternative embodiments, the substrate 310 may include an epitaxial layer. Furthermore, the substrate 310 may include a semiconductor-on-insulator (SOI) structure having a buried dielectric layer therein. The buried dielectric layer may be, for example, a buried oxide (BOX) layer. The SOI structure may be formed by a method referred to as separation by implantation of oxygen (SIMOX) technology, wafer bonding, selective epitaxial growth (SEG), or other appropriate method.

Dummy gate stacks 320 are formed over the substrate 310. A space 305 is defined between two adjacent dummy gate stacks 320. The dummy gate stack 320 includes a dummy gate dielectric 322 and a dummy gate electrode 324 over the dummy gate dielectric 322. In some embodiments, a dielectric layer (not shown) and a dummy gate layer (not shown) may be sequentially formed over the substrate 310. The dummy gate layer and the dielectric layer are then patterned to respectively form the dummy gate electrode 324 and the dummy gate dielectric 322. In some embodiments, the dummy gate electrode 324 may be made of polycrystalline-silicon (poly-Si), polycrystalline silicon-germanium (poly-SiGe), or other suitable materials. The dummy gate dielectric 322 may be made of silicon dioxide or other suitable materials.

Spacer structures 330 are at least formed on opposite sides of the dummy gate stacks 320. The spacer structures 330 include one or more dielectric materials, such as silicon oxide, silicon nitride, silicon oxynitride, SiCN, SiCxOyNz, or combinations thereof. The spacer structures 330 can be formed using a deposition method, such as plasma enhanced chemical vapor deposition (PECVD), low-pressure chemical vapor deposition (LPCVD), sub-atmospheric chemical vapor deposition (SACVD), or the like. The formation of the spacer structures 330 may include blanket forming spacer layers and then performing etching operations to remove the horizontal portions of the spacer layers. The remaining vertical portions of the spacer layers form the spacer structures 330.

A plurality of source/drain features 340 are formed (partially) in the substrate 310 and adjacent to the spacer structures 330. In some embodiments, the source/drain features 340 can be doped regions. In some other embodiments, the source/drain features 340 can be epitaxial structures. For example, a plurality of recesses can be formed in the substrate 310, and semiconductor materials are then epitaxially grown in the recesses to form the epitaxial structures. In some other embodiments, the epitaxial structures can be formed without forming the recesses.

A contact etch stop layer (CESL) 350 is conformally formed over the source/drain features 340, the spacer structures 330, the dummy gate stacks 320, and the substrate 310. In some embodiments, the CESL 350 can be a stressed layer or layers. In some embodiments, the CESL 350 has a tensile stress and is formed of $Si_3N_4$. In some other embodiments, the CESL 350 includes materials such as oxynitrides. In yet some other embodiments, the CESL 350 may have a composite structure including a plurality of layers, such as a silicon nitride layer overlying a silicon oxide layer. The CESL 350 can be formed using plasma enhanced CVD (PECVD), however, other commonly used methods such as low pressure CVD (LPCVD), atomic layer deposition (ALD), and the like can also be used.

Figure 3B:
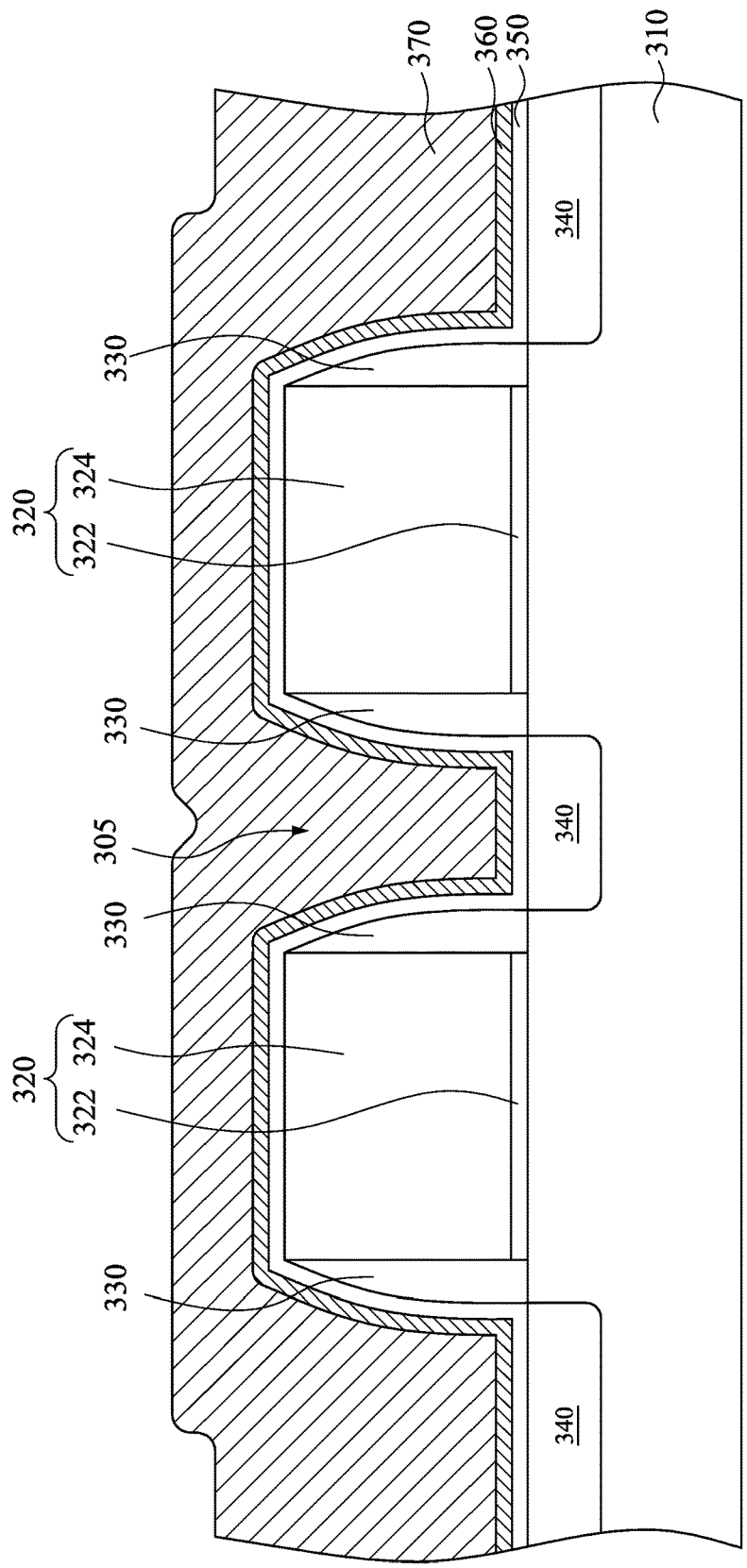

Reference is made to FIG. 3B. A metal-contained ternary dielectric layer 360 is conformally formed over the structure of FIG. 3A (i.e., over the CESL 350). Since the metal-contained ternary dielectric layer 360 and the first liner layer 140 (see FIG. 1C) have the same or similar material, structure, and/or manufacturing processes, a description in this regard will not be repeated hereinafter. Then, a metal-contained ternary dielectric material 370 is formed over the metal-contained ternary dielectric layer 360 and fills the space 305 between the dummy gate stacks 320. Since the top metal oxide compound layer 370 and the dielectric material 150 (see FIG. 1D) have the same or similar material, structure, and/or manufacturing processes, a description in this regard will not be repeated hereinafter.

Figure 3C:
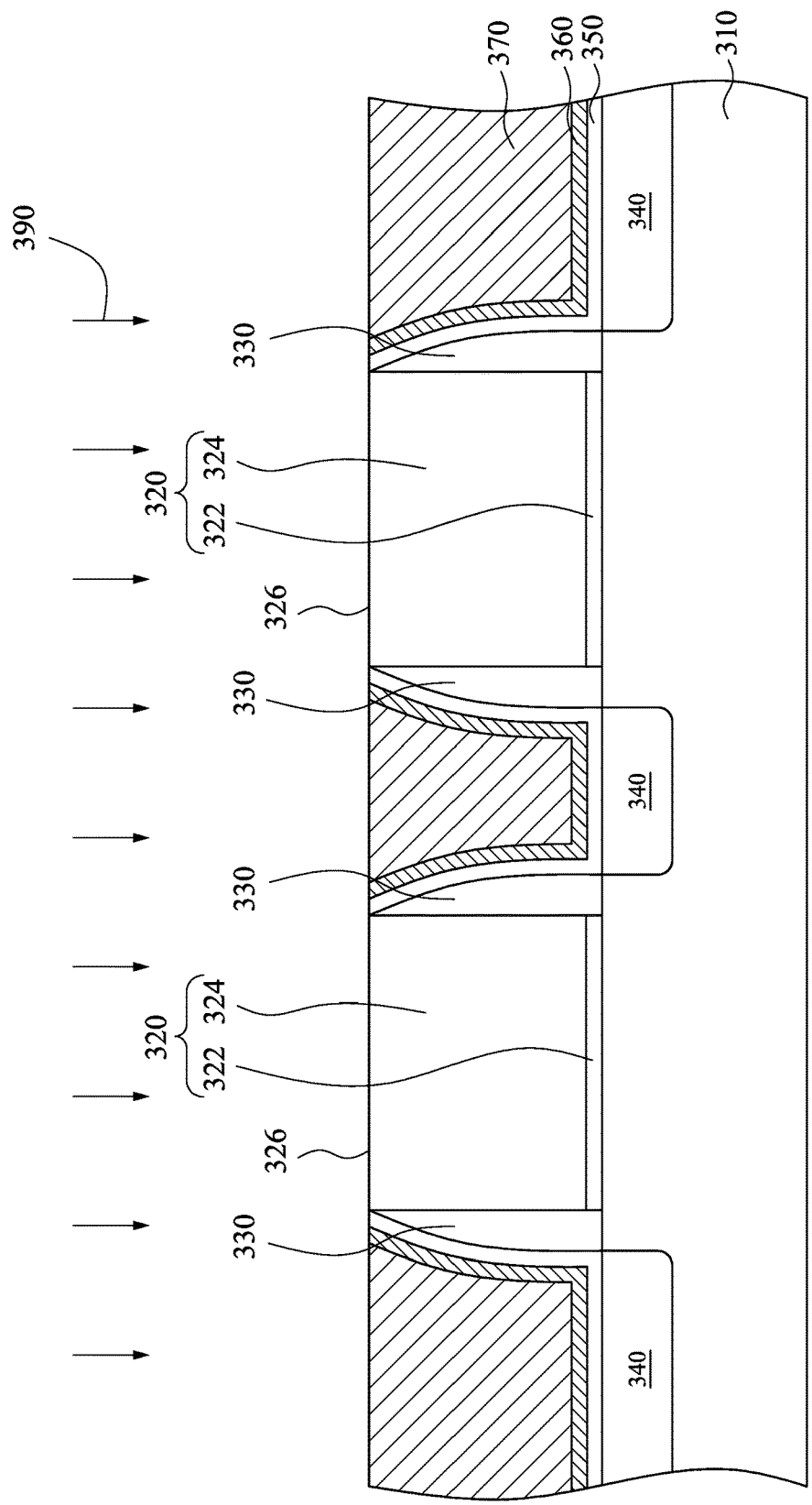

Reference is made to FIG. 3C. An anneal process 390 is performed on the metal-contained ternary dielectric layer 360 and the metal-contained ternary dielectric material 370. The anneal process 390 is performed to remove the hydrogen in the metal-contained ternary dielectric layer 360 and the metal-contained ternary dielectric material 370 to strengthen the mechanical strength thereof. In some embodiments, since the metal-contained ternary dielectric layer 360 and the metal-contained ternary dielectric material 370 are not flowable materials, a post-annealing process (for curing the flowable materials) can be omitted after the deposition of these two layers. That is, the anneal process 390 is optional. Furthermore, even though the anneal process 390 is performed, the anneal temperature of the anneal process 390 is lower than an anneal temperature for curing a flowable material. In some embodiments, when the metal-contained ternary dielectric layer 360 and the metal-contained ternary dielectric material 370 are made of AlZrO, the anneal process 390 can be performed at a temperature in a range from about 250° C. to about 600° C. In some other embodiments, when the metal-contained ternary dielectric layer 360 and the metal-contained ternary dielectric material 370 are made of HfSiO, the anneal process 390 can be performed at a temperature in a range from about 350° C. to about 650° C. In still some other embodiments, when the metal-contained ternary dielectric layer 360 and the metal-contained ternary dielectric material 370 are made of MgSiO, the anneal process 390 can be performed at a temperature in a range from about 350° C. to about 1100° C. If the annealing temperature is out of the aforementioned ranges, the annealing process 390 may not remove hydrogen from the metal-contained ternary dielectric layer 360 and the metal-contained ternary dielectric material 370 efficiently. Following a planarization process is performed to level the top surfaces of the metal-contained ternary dielectric layer 360, the metal-contained ternary dielectric material 370, and the CESL 350 with the top surfaces 326 of the dummy gate stacks 320. In this regard, the remaining metal-contained ternary dielectric layer 360 and metal-contained ternary dielectric material 370 are referred as to an interlayer dielectric (ILD). The performance of the planarized structure can be improved since the metal-contained ternary dielectric layer 360 and the metal-contained ternary dielectric material 370 have good mechanical strength and chemical selectivity. In some embodiments, the planarization process is a chemical-mechanical polishing (CMP) process.

Figure 3D:
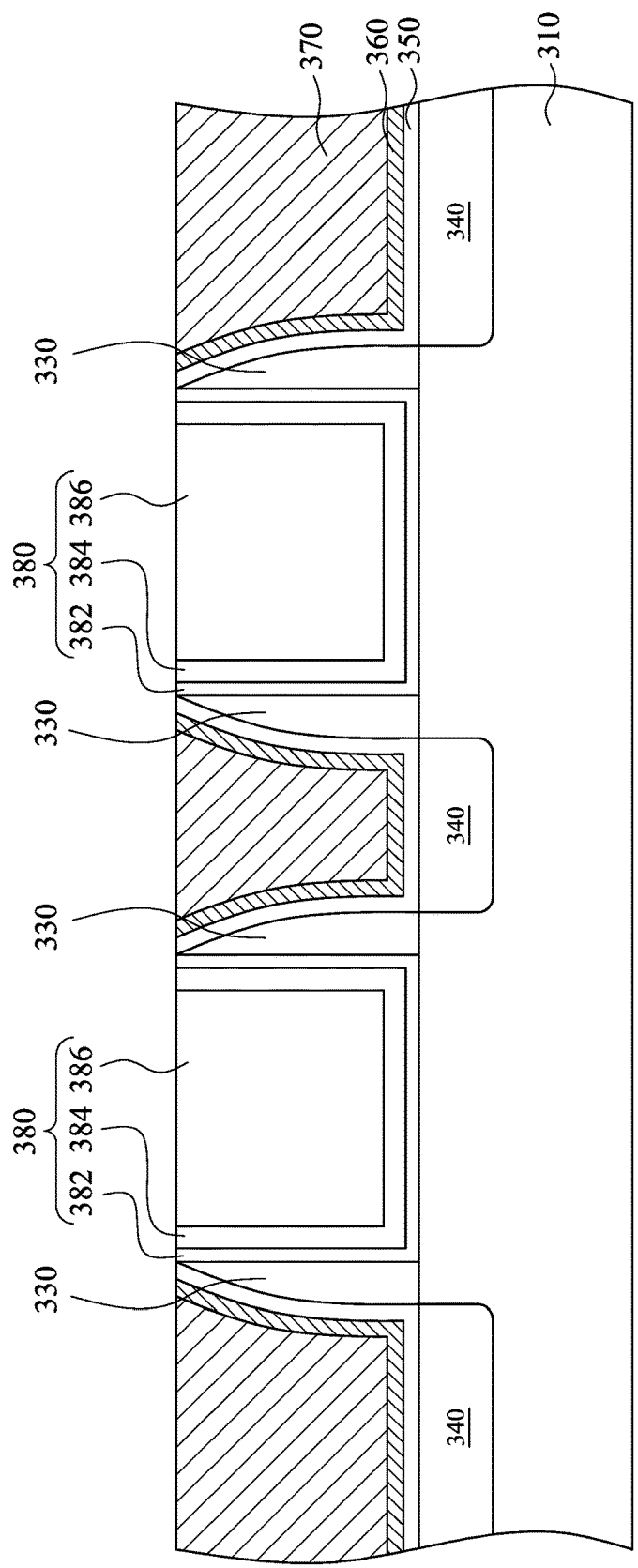

Reference is made to FIG. 3D. A replacement gate (RPG) process scheme is employed. In the RPG process scheme, a dummy polysilicon gate (the dummy gate electrode 324 (see FIG. 3A) in this case) is formed in advance and is replaced later by a metal gate. In some embodiments, the dummy gate electrode 324 is removed to form an opening 326 with the spacer structures 330 as its sidewalls. In some other embodiments, the dummy gate dielectric 322 (see FIG. 3C) is removed as well. Alternatively, in some embodiments, the dummy gate electrode 324 is removed while the dummy gate dielectric 322 retains. The dummy gate electrode 324 (and the dummy gate dielectric 322) may be removed by dry etch, wet etch, or a combination of dry and wet etch. For example, a wet etch process may include exposure to a hydroxide containing solution (e.g., ammonium hydroxide), deionized water, and/or other suitable etchant solutions. The performance of the remaining structure after the removing process can be improved since the metal-contained ternary dielectric layer 360 and the metal-contained ternary dielectric material 370 have good etching selectivity to silicon, oxide, and/or nitride. That is, the metal-contained ternary dielectric layer 360, the metal-contained ternary dielectric material 370 are not removed (or barely removed) during the removing process.

Metal gate structures 380 are respectively formed in the openings 326 and between the spacer structures 330. The metal gate structure 380 is formed by the deposition of metal layers including conductive metal such as aluminum, copper, tungsten, titanium, or other suitable materials. In some embodiments, depositing the metal gate structures 380 includes depositing a high-k dielectric layer 382 and at least one work function layer 384 prior to depositing a metal fill layer 386.

Figure 4A:
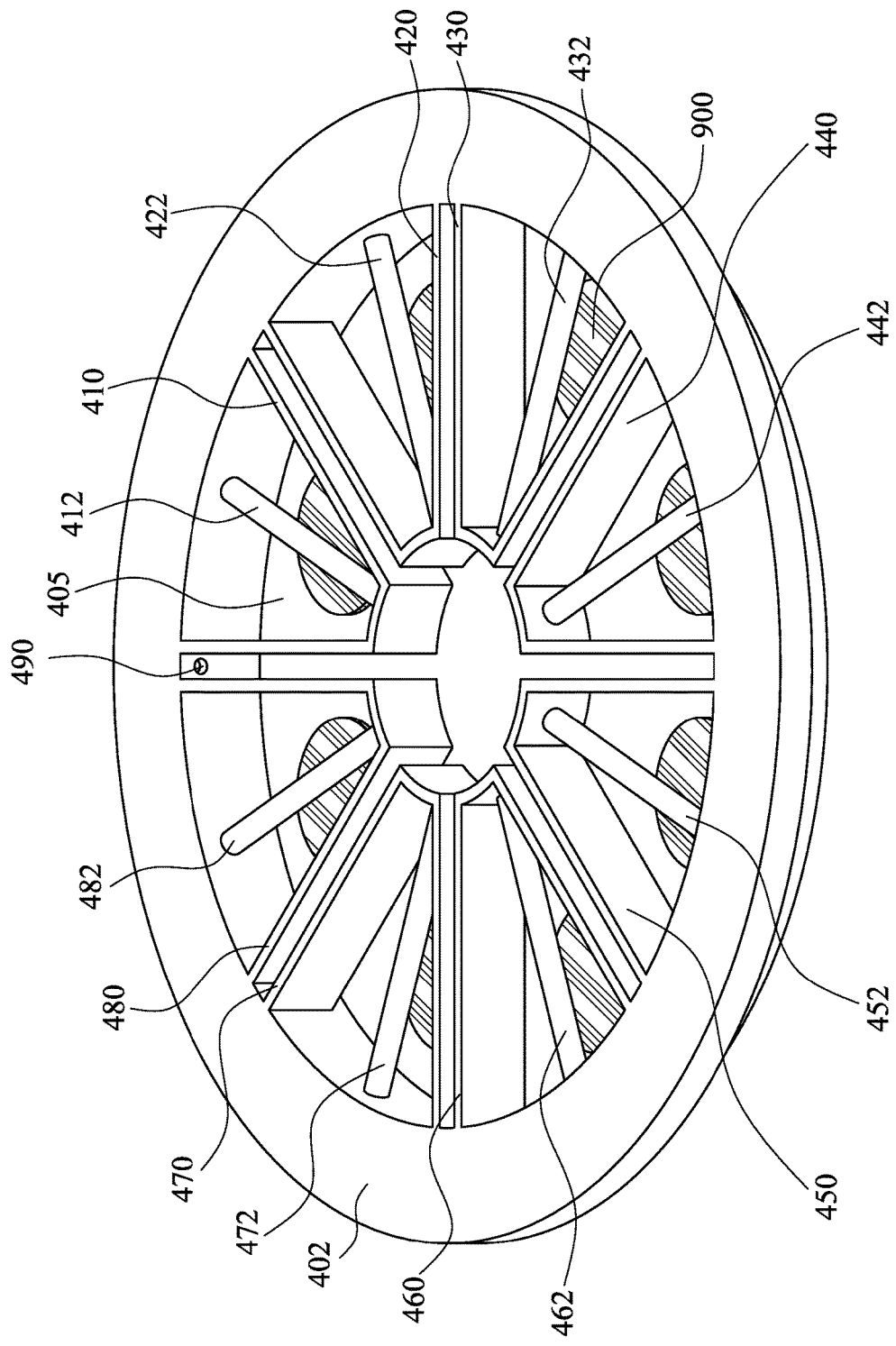
FIG. 4A is a perspective view of a rotary deposition apparatus 400 and a wafer in accordance with some embodiments of the present disclosure.
Figure 4B:
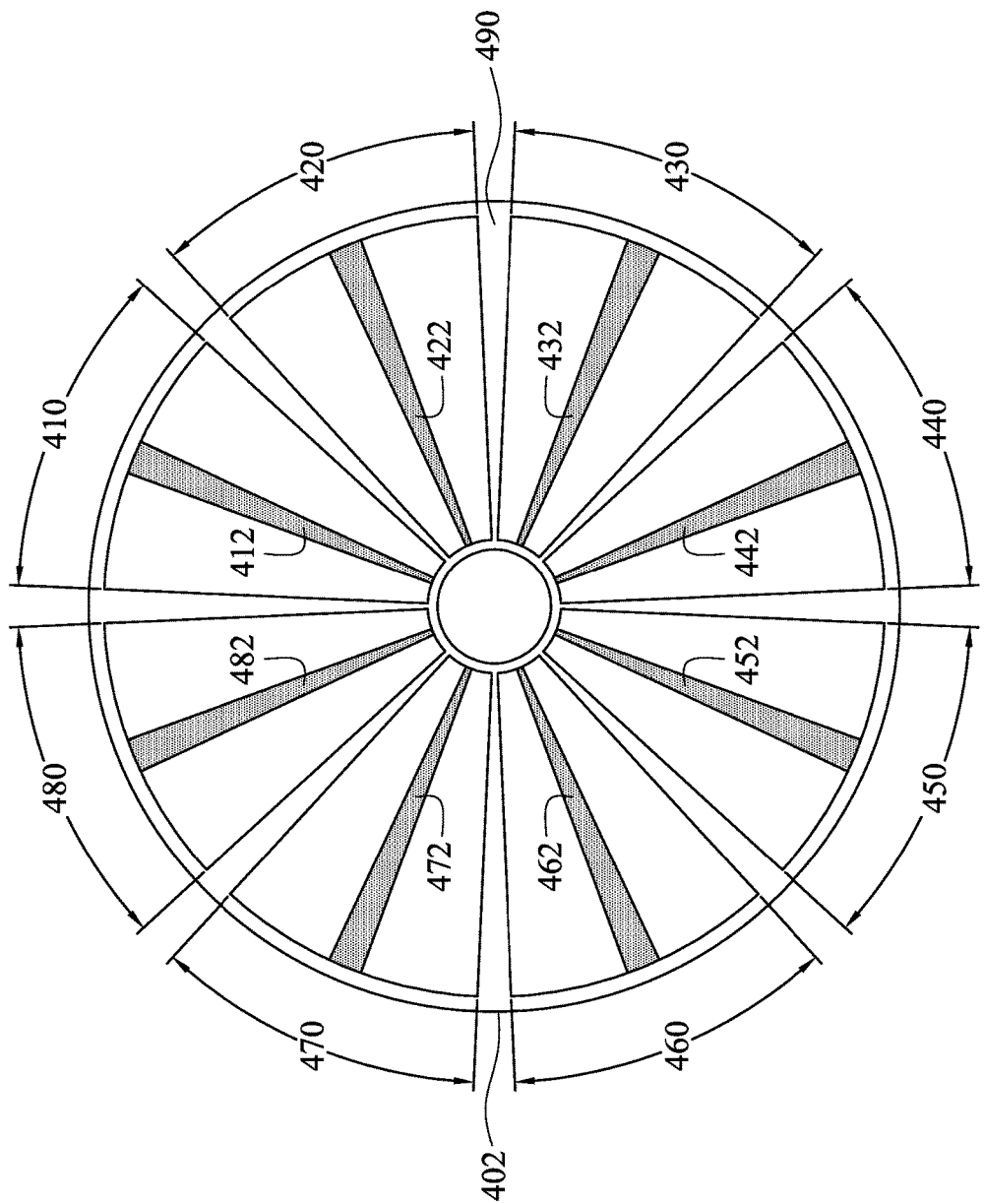
FIG. 4B is a top view of the rotary deposition apparatus of FIG. 4A.

FIG. 4A is a perspective view of a rotary deposition apparatus 400 and a wafer 900 in accordance with some embodiments of the present disclosure, and FIG. 4B is a top view of the rotary deposition apparatus 400 of FIG. 4A. In some embodiments, the first liner layer 140 and the dielectric material 150 in FIG. 1D and the metal-contained ternary dielectric layer 360 and the metal-contained ternary dielectric material 370 in FIG. 3B can be formed using the rotary deposition apparatus 400. The rotary deposition apparatus 400 includes a deposition process chamber 402, a rotary susceptor 405, a plurality of purge gas supplying pipes 490, and a plurality of injectors 412, 422, 432, 442, 452, 462, 472, and 482. The rotary susceptor 405 is disposed in the deposition process chamber 402. The purge gas supplying pipes 490 are disposed in the deposition process chamber 402, over the rotary susceptor 405, and configured to divide the deposition process chamber 402 into plurality of segments 410, 420, 430, 440, 450, 460, 470, and 480. In some embodiments, the segments 410, 420, 430, and 440 are configured to form the first liner layer 140 and the metal-contained ternary dielectric layer 360 while the segments 450, 460, 470, and 480 are configured to form the dielectric material 150 and the metal-contained ternary dielectric material 370. That is, the injector 412 is configured to provide the first precursor P1 (see FIG. 1C) into the deposition process chamber 402, the injector 432 is configured to provide the second precursor P2 (see FIG. 1C) into the deposition process chamber 402, the injector 452 is configured to provide the third precursor P3 (see FIG. 1D) into the deposition process chamber 402, the injector 472 is configured to provide the fourth precursor P4 (see FIG. 1D) into the deposition process chamber 402, and the injectors 422, 442, 462, and 482 are configured to provide the reaction gas (i.e., oxygen-contained gas) into the deposition process chamber 402. Each of the injectors 412, 422, 432, 442, 452, 462, 472, and 482 has openings (not shown) facing the rotary susceptor 405 (and the wafer 900), and the gases in the injectors 412, 422, 432, 442, 452, 462, 472, and 482 flow out from the openings.

During the formation of the first liner layer 140 (or the metal-contained ternary dielectric layer 360), the injectors 412, 422, 432, and 442 are open while the injectors 452, 462, 472, and 482 are closed. At least one wafer 900 (such as the structure in FIG. 1B or FIG. 3A) is disposed in the deposition process chamber 402. In some embodiments, the deposition process chamber 402 can accommodate a plurality of wafers 900 as shown in FIG. 4A. The rotary susceptor 405 is rotated clockwise, and the deposition process chamber 402 is set to be vacuum. The rotary susceptor 405 is heated to a predetermined temperature (for example, in a range from about 80° C. to about 350° C.) by a heater in advance, and the wafers 900 can also be heated at substantially the same temperature by being placed on the rotary susceptor 405. After the wafers 900 are heated and maintained at the predetermined temperature, purge gases (such as $N_2$) enter the deposition process chamber 402 from the purge gas supplying pipes 490. The purge gases separate the segments 410, 420, 430, 440, 450, 460, 470, and 480 and prevent gases from flowing among different segments 410, 420, 430, 440, 450, 460, 470, and 480. Then, an inner pressure of the process chamber 402 is set at a predetermined process pressure by a pressure adjusting portion and a vacuum pump. Next, the first precursor P1 is supplied to the segment 410 from the injector 412, the second precursor P2 is supplied to the segment 430 from the injector 432, and the reaction gas is supplied to the segments 420 and 440 from the injectors 422 and 442.

When the wafer 900 passes through the segment 410 below the injector 412 due to the rotation of the rotary susceptor 405, the first precursor P1 is adsorbed on the wafer 900. Next, the reaction gas (including oxygen) is adsorbed on the wafer 900 when the wafer 900 passes through the segment 420 below the injector 422, and thus the first precursor P1 on the wafer 900 is oxidized by the reaction gas. Namely, when the wafer 900 passes through both the segments 410 and 420 once, a monolayer of metal oxide is formed on the wafer 900. The wafer 900 then passes through the segment 430 below the injector 432, the second precursor P2 is adsorbed on the wafer 900. Subsequently, the reaction gas (including oxygen) is adsorbed on the wafer 900 when the wafer 900 passes through the segment 440 below the injector 442, and thus the second precursor P2 on the wafer 900 is oxidized by the reaction gas. Namely, when the wafer 900 passes through both the segments 430 and 440 once, another monolayer of metal oxide is formed on the wafer 900. Then, the wafer 900 is rotated and passes through the segments 410, 420, 430, and 440 plural times, and thus the first liner layer 140 (or the metal-contained ternary dielectric layer 360) having a predetermined thickness is deposited on the wafer 900. After the first liner layer 140 (or the metal-contained ternary dielectric layer 360) having the predetermined thickness is deposited, the supplying of the first precursor P1, the second precursor P2, and the reaction gas are stopped.

Then, the formation of the dielectric material 150 (or the metal-contained ternary dielectric material 370) is followed. The injectors 452, 462, 472, and 482 are open while the injectors 412, 422, 432, and 442 are closed. In this stage, the rotation speed of the rotate susceptor 405 and/or the flow rates of the precursors and reaction gases can be tuned to increase the deposition rate of the dielectric material 150 (or the metal-contained ternary dielectric material 370). For example, the rotation speed of the rotate susceptor 405 is decreased and/or the flow rates of the precursors and reaction gases are increased compared to forming the first liner layer 140 (or the metal-contained ternary dielectric layer 360). Next, the third precursor P3 is supplied to the segment 450 from the injector 452, the fourth precursor P4 is supplied to the segment 470 from the injector 472, and the reaction gas is supplied to the segments 460 and 480 from the injectors 462 and 482.

When the wafer 900 passes through the segment 450 below the injector 452, the third precursor P3 is adsorbed on the wafer 900. Next, the reaction gas (including oxygen) is adsorbed on the wafer 900 when the wafer 900 passes through the segment 460 below the injector 462, and thus the third precursor P3 on the wafer 900 is oxidized by the reaction gas. Namely, when the wafer 900 passes through both the segments 450 and 460 once, a metal oxide compound layer is formed on the wafer 900. The wafer 900 then passes through the segment 470 below the injector 472, and the fourth precursor P4 is adsorbed on the wafer 900.

Subsequently, the reaction gas (including oxygen) is adsorbed on the wafer 900 when the wafer 900 passes through the segment 480 below the injector 482, and thus the fourth precursor P4 on the wafer 900 is oxidized by the reaction gas. Namely, when the wafer 900 passes through both the segments 470 and 480 once, another metal oxide compound layer is formed on the wafer 900. Then, the wafer 900 is rotated and passes through the segments 450, 460, 470, and 480 plural times, and thus the dielectric material 150 (or the metal-contained ternary dielectric material 370) having a predetermined thickness is deposited on the wafer 900. In some embodiments, the segments 460 and 480 are equipped with plasma modules, such as microwave plasma modules, to produce radicals for reaction. After the dielectric material 150 (or the metal-contained ternary dielectric material 370) having the predetermined thickness is deposited, the supplying of the third precursor P3, the fourth precursor P4, and the reaction gas are stopped. Next, the wafers are transferred out from the deposition process chamber 402.

In some embodiments, the rotary deposition apparatus 400 can be used to form the first liner layer 140 and the dielectric material 150 in FIG. 1D and the metal-contained ternary dielectric layer 360 and the metal-contained ternary dielectric material 370 in FIG. 3B that have similar deposition temperatures. For example, the rotary deposition apparatus 400 can be used to form the first liner layer 140 and the dielectric material 150 in FIG. 1D (the metal-contained ternary dielectric layer 360 and the metal-contained ternary dielectric material 370 in FIG. 3B) that are made of MgSiO. During the formation of the MgSiO first liner layer 140 or the MgSiO metal-contained ternary dielectric layer 360, the temperature of the deposition process chamber 402 is in a range from about 80° C. to about 350° C., the injector 412 provides $Mg[Cp(Et)Cp]_2$, the injector 432 provides $SiH_2[N(Et)_2]_2$, and the injectors 422 and 442 provide oxygen sources such as $H_2O$ or $O_2$. Moreover, the injectors 452, 462, 472, and 482 are closed.

During the formation of the MgSiO dielectric material 150 or the MgSiO metal-contained ternary dielectric material 370, the rotation speed of the rotate susceptor 405 and/or the flow rates of the precursors and reaction gases are tuned to increase the deposition rate of the MgSiO layer. Moreover, the temperature of the deposition process chamber 402 is in a range from about 80° C. to about 350° C., the injector 452 provides $Mg[Cp]_2$, the injector 472 provides $SiH_2[N(Me)]_2$, and the injectors 462 and 482 provide oxygen sources such as NO, $NO_2$, or $O_2$. Furthermore, the segments 460 and 480 are equipped with plasma modules to produce radicals for reaction. Moreover, the injectors 412, 422, 432, and 442 are closed.

After the formation of the MgSiO dielectric material 150 or the MgSiO metal-contained ternary dielectric material 370, an anneal process can be performed on the MgSiO layers to remove the hydrogen in the layers 140 and 150 (or the layers 360 and 370) to strengthen the mechanical strength thereof. For example, the anneal process is performed under a temperature in a range of about 350° C. to about 1100° C.

According to some embodiments, a metal-contained ternary dielectric structure including a conformal bottom layer and a filling top layer are formed. The metal-contained ternary dielectric structure has good mechanical strength and chemical selectivity, such that the metal-contained ternary dielectric structure is not deformed after a planarization process. Moreover, the metal-contained ternary dielectric structure also has good etching selectivity to silicon, oxide, and/or nitride, so the metal-contained ternary dielectric structure is not easy to be removed during the etching process. Furthermore, the metal-contained ternary dielectric structure may be formed in the same deposition process chamber, resulting in time saving and cost down.

According to some embodiments, a method includes etching a semiconductor substrate to form a trench extending from a top surface of the semiconductor substrate into the semiconductor substrate. A first liner layer is formed on sidewalls and a bottom of the trench. The trench is filled with a dielectric material after depositing the first liner layer. The dielectric material and the first liner layer include substantially the same metal-contained ternary dielectric material. Excess portions of the dielectric material and the first liner layer over the top surface of the semiconductor substrate are removed.

In some embodiments, the metal-contained ternary dielectric material is in a metastable phase.

In some embodiments, the metal-contained ternary dielectric material is a solid solution.

In some embodiments, depositing the first liner layer is performed by an atomic layer deposition process.

In some embodiments, the method further includes depositing a second liner layer on the sidewalls and the bottom of the trench prior to depositing the first liner layer. The second liner layer includes nitrogen.

In some embodiments, the metal-contained ternary dielectric material includes silicon.

In some embodiments, the metal-contained ternary dielectric material comprises oxygen.

In some embodiments, the metal-contained ternary dielectric material includes Al, Mg, Ti, Zn, Zr, Y, Ta, Hf, or combinations thereof.

In some embodiments, depositing the first liner layer and filling the trench are performed in the same chamber.

In some embodiments, the method further includes annealing the first liner layer and the dielectric material.

According to some embodiments, a method includes forming first and second gate stacks over a semiconductor substrate. A metal-contained ternary dielectric layer is conformally deposited over the first and second gate stacks and the semiconductor substrate. A space between the first and second gate stacks is filled with a metal-contained ternary dielectric material. Excess portions of the metal-contained ternary dielectric layer and the metal-contained ternary dielectric material over top surfaces of the first and second gate stacks are removed.

In some embodiments, the metal-contained ternary dielectric layer and the metal-contained ternary dielectric material includes substantially the same oxide material.

In some embodiments, the metal-contained ternary dielectric layer includes a material in a metastable phase.

In some embodiments, the metal-contained ternary dielectric layer includes a solid solution.

In some embodiments, depositing the metal-contained ternary dielectric layer and filling the space are performed in the same chamber.

In some embodiments, the metal-contained ternary dielectric layer includes Al, Mg, Ti, Zn, Zr, Y, Ta, Hf, or combinations thereof.

In some embodiments, the metal-contained ternary dielectric layer includes silicon.

According to some embodiments, a device includes a semiconductor substrate, and a shallow trench isolation (STI) structure in the semiconductor substrate. The STI structure includes an isolation material and a first liner layer. The isolation material is in the semiconductor substrate. The first liner layer wraps around the isolation material. The isolation material and the first liner layer include substantially the same metal-contained ternary oxide material.

In some embodiments, the device further includes a second liner layer wrapping around the first liner layer. The second liner layer comprises nitrogen.

In some embodiments, the isolation material includes Al, Mg, Ti, Zn, Zr, Y, Ta, Hf, or combinations thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching a semiconductor substrate to form a trench extending from a top surface of the semiconductor substrate into the semiconductor substrate;
   depositing a first liner layer on sidewalls and a bottom of the trench;
   filling the trench with a dielectric material after depositing the first liner layer, wherein the dielectric material and the first liner layer comprise substantially the same metal-contained ternary dielectric material; and
   removing excess portions of the dielectric material and the first liner layer over the top surface of the semiconductor substrate.

2. The method of claim 1, wherein the metal-contained ternary dielectric material is in a metastable phase.

3. The method of claim 1, wherein the metal-contained ternary dielectric material is a solid solution.

4. The method of claim 1, wherein depositing the first liner layer is performed by an atomic layer deposition process.

5. The method of claim 1, further comprising:
   depositing a second liner layer on the sidewalls and the bottom of the trench prior to depositing the first liner layer, wherein the second liner layer comprises nitrogen.

6. The method of claim 1, wherein the metal-contained ternary dielectric material comprises silicon.

7. The method of claim 1, wherein the metal-contained ternary dielectric material comprises oxygen.

8. The method of claim 1, wherein the metal-contained ternary dielectric material comprises Al, Mg, Ti, Zn, Zr, Y, Ta, Hf, or combinations thereof.

9. The method of claim 1, wherein depositing the first liner layer and filling the trench are performed in the same chamber.

10. The method of claim 1, further comprising:
    annealing the first liner layer and the dielectric material.

11. A method comprising:
    forming first and second gate stacks over a semiconductor substrate;
    depositing a metal-contained ternary dielectric layer conformally over the first and second gate stacks and the semiconductor substrate;
    filling a space between the first and second gate stacks with a metal-contained ternary dielectric material; and
    removing excess portions of the metal-contained ternary dielectric layer and the metal-contained ternary dielectric material over top surfaces of the first and second gate stacks.

12. The method of claim 11, wherein the metal-contained ternary dielectric layer and the metal-contained ternary dielectric material comprise substantially the same oxide material.

13. The method of claim 11, wherein the metal-contained ternary dielectric layer comprises a material in a metastable phase.

14. The method of claim 11, wherein the metal-contained ternary dielectric layer comprises a solid solution.

15. The method of claim 11, wherein depositing the metal-contained ternary dielectric layer and filling the space are performed in the same chamber.

16. The method of claim 11, wherein the metal-contained ternary dielectric layer comprises Al, Mg, Ti, Zn, Zr, Y, Ta, Hf, or combinations thereof.

17. The method of claim 11, wherein the metal-contained ternary dielectric layer comprises silicon.

18. A device comprising:
    a semiconductor substrate; and
    a shallow trench isolation (STI) structure in the semiconductor substrate, the STI structure comprising:
      an isolation material in the semiconductor substrate; and
      a first liner layer wrapping around the isolation material, wherein the isolation material and the first liner layer comprise substantially the same metal-contained ternary oxide material.

19. The device of claim 18, further comprising:
    a second liner layer wrapping around the first liner layer, wherein the second liner layer comprises nitrogen.

20. The device of claim 18, wherein the isolation material comprises Al, Mg, Ti, Zn, Zr, Y, Ta, Hf, or combinations thereof.

* * * * *